United States Patent [19]
Yoshida

[11] Patent Number: 5,496,767
[45] Date of Patent: Mar. 5, 1996

[54] SEMICONDUCTOR LASER AND MANUFACTURING METHOD OF THE SAME

[75] Inventor: Ichiro Yoshida, Yokohama, Japan

[73] Assignee: Sumitomo Electric Industries, Ltd., Osaka, Japan

[21] Appl. No.: 233,437

[22] Filed: Apr. 28, 1994

Related U.S. Application Data

[60] Continuation of Ser. No. 126,623, Sep. 27, 1993, which is a division of Ser. No. 761,069, Sep. 18, 1991, Pat. No. 5,276,698.

[30] Foreign Application Priority Data

Sep. 20, 1990 [JP] Japan ..................... 2-250743
Oct. 18, 1990 [JP] Japan ..................... 2-280041

[51] Int. Cl.$^6$ ..................................... H01L 21/20
[52] U.S. Cl. ............... 437/129; 437/110; 437/126; 437/127; 437/133; 117/102; 117/953
[58] Field of Search ................. 437/126, 129, 437/133, 110, 127; 117/102, 105, 953

[56] References Cited

U.S. PATENT DOCUMENTS 5,034,957   7/1991   Ohba et al. ................. 372/45

FOREIGN PATENT DOCUMENTS 172242   2/1986   European Pat. Off. ............... 437/129
2193598   2/1988   United Kingdom .

OTHER PUBLICATIONS

Ludowise in "MOCVD of III–V semiconductors" in Jr. Appl. Phys. 58(8), Oct. 1985, pp. R31–R55.
Yablonovitch et al., Reductio of Lasing Threshold Current Density by the Lowering of Valence Band Effective Mass, Journal of Lightwave Technology, vol. LT–4, No. 5, May 1986, pp. 504–506.
T. Katsuyama et al., Very Low Threshold Current AlGaInP/ $Ga_xIn_{1-x}P$ Strained Single Quantum Well Visible Laser Diode, Electronics Letters, vol. 26, No. 17, Aug. 16th 1990, pp. 1375–1377.
Kawata et al., Room–Temperature, Continuous–Wave Operation For Mode–Stabilised AlGaInP Visible–Light Semiconductor Laser With A Multiquantum–Well Active Layer, Electronics Letters, vol. 24, No. 24, Nov. 24th 1988, pp. 1409–1490.
Nam et al., Short–wavelength (~625 nm) room–temperature continuous laser operation of $In_{0.5}(Al_xGa_{1-x})_{0.5}$ P quantum well heterostructures, American Institute of Physics 1988, Appl Phys Lett 52 (16), Apr. 18, 1988 pp. 1329–1331.
Fletcher et al., CW room temperature operation (<640 nm) of AlGaInP multi–quantum–weil lasers, Inst. Phys. Conf. Ser. No. 96: Chapter 8, 1989 IOP Publishing Ltd., pp. 563–566.

Primary Examiner—R. Bruce Breneman
Assistant Examiner—Ramamohan Rao Paladugu
Attorney, Agent, or Firm—Cushman, Darby & Cushman

[57] ABSTRACT

A semiconductor laser comprises an optical wave guide layer including an AlGaInP active layer and AlGaInP optical confinement layers holding the active layer therebetween. A well structure of an energy band is formed and a compressive stress is applied to the activation layer by the difference between the compositions of the activation layer and the optical confinement layers. Since the compressive stress is applied to the activation layer, the oscillation threshold is lower than that of an un-strained device. Accordingly, the rise of the oscillation threshold due to the addition of Al is compensated and continuous oscillation at room temperature is attained and visible light having a wavelength of 0.67 μm or lower, which has been difficult to attain in the past, is produce. The semiconductor laser having a multi-quantum well structure is manufactured by using AlGaInP or GaInP as a semiconductor material of the multi-quantum well structure and epitaxially growing by periodically changing a supply rate of only In. Through a very simple method of periodically changing the supply rate of only In, a well layer having a compressive stress applied thereto and a barrier layer having a tensile stress applied thereto are alternately grown and the activation layer having the desired strained multi-quantum well structure is produced.

13 Claims, 7 Drawing Sheets

SEMICONDUCTOR LASER AND MANUFACTURING METHOD OF THE SAME

CROSS REFERENCE TO RELATED APPLICATIONS

This application is a continuation of U.S. application No. 08/126,623, filed Sep. 27, 1993, which was a divisional of U.S. application No. 07/761,069, filed Sep. 18, 1991, now U.S. Pat. No. 5,276,698 issued Jan. 4, 1994.

BACKGROUND OF THE INVENTION

1. Field of the Invention

The present invention relates to a semiconductor laser and a manufacturing method of the same, and more particularly to a semiconductor laser suitable for the emission of visible light and a manufacturing method of the same.

2. Related Background Art

Several years ago, a He-Ne gas laser was used in most cases to generate a bright red laser beam. Recently, the practical use of a visible light semiconductor laser which uses GaInP as a active layer has been so advanced that a light having a wavelength of 0.67 µm is generated by the semiconductor laser.

However, since the wavelength of 0.67 µm is longer than the wavelength of 0.6328 µm of the He-Ne gas laser, the visual sensitivity thereto is lower than that of the He-Ne gas laser. As a result, in the field of the semiconductor laser, there is a demand for further shortening the wavelength to approach to the wavelength of 0.6328 µm of the He-Ne gas laser. On the other hand, it has been proved that the emission wavelength can be further shortened by adding Al to the active layer. However, when Al is added to the active layer, non-radiative recombination centers associated with Al increase and the confinement of carriers is diminished by the large band gap of the active layer. As a result, the laser oscillation is hard to be obtained and it is difficult to continuously oscillate at room temperature, or the durability is short even if the continuous oscillation is attained.

SUMMARY OF THE INVENTION

In order to solve the above problem, a semiconductor laser of the present invention has an optical waveguide layer which comprises an AlGaInP active layer and AlGaInP optical confinement layers which hold the active layer therebetween. A well structure of an energy band is formed by the difference between compositions of the active layer and the optical confinement layer and a compressive stress is applied to the active layer.

Since the compressive stress is applied to the active layer in the present invention, the oscillation threshold is lower than that of an unstrained type. Accordingly, it can oppose the rise of the oscillation threshold due to the addition of Al and continuous oscillation at room temperature is attained. Thus, visible light having a wavelength of 0.67 µm or smaller, which has not been attainable in the past, is produced.

The compressive stress is imparted by a strained due to a difference between lattice constants of the active layer to the GaAs substrate. Thus, it should be thin to the extent that misfit dislocations are not generated. In the present invention, since the optical confinement layers are provided above and below the active layer, the total thickness of the optical waveguide layer is sufficiently large.

The present invention is particularly useful for a laser which continuously oscillates at a room temperature at a wavelength of 0.64 µm or shorter.

A semiconductor laser having a multi-quantum well structure is manufactured by using AlGaInP or GaInP as a semiconductor material for a multi-quantum well structure and epitaxially growing it while periodically varying the supply rate of only In.

When organo-metallic vapor phase epitaxy (OMVPE) is used in the epitaxial growth, the supply rate of only In is periodically changed by periodically changing a flow rate of organic In gas. When molecular beam epitaxy (MBE) is used in the epitaxial growth, two In injection cells are provided and one of the In injection cells is kept active while the other In injection cell is periodically activated and deactivated to periodically change the supply rate of only In.

By periodically changing the supply rate of In, a well layer having a compressive stress applied thereto and a barrier layer having a tensile stress applied thereto are alternately grown to form a strained multi-quantum well structure.

Thus, the active layer having the desired strained multi-quantum well structure is formed by a very simple method of periodically changing the supply rate of In, and a semiconductor laser having a low threshold and a high power can be easily manufactured.

It is one object of the present invention to provide a semiconductor laser using a GaAs substrate comprising an optical waveguide layer having an AlGaInP active layer and AlGaInP optical confinement layers holding said active layer therebetween, wherein a well structure of the energy band is formed and a compressive stress is applied to said active layer by a difference between compositions of said active layer and said optical confinement layers.

It is a further object of the present invention to provide a method for manufacturing a semiconductor laser having a multi-quantum well structure of AlGaInP or GaInP formed in an active layer, comprising the step of: epitaxially growing the multi-quantum well structure by periodically changing a supply rate of only In.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

Figure 1:
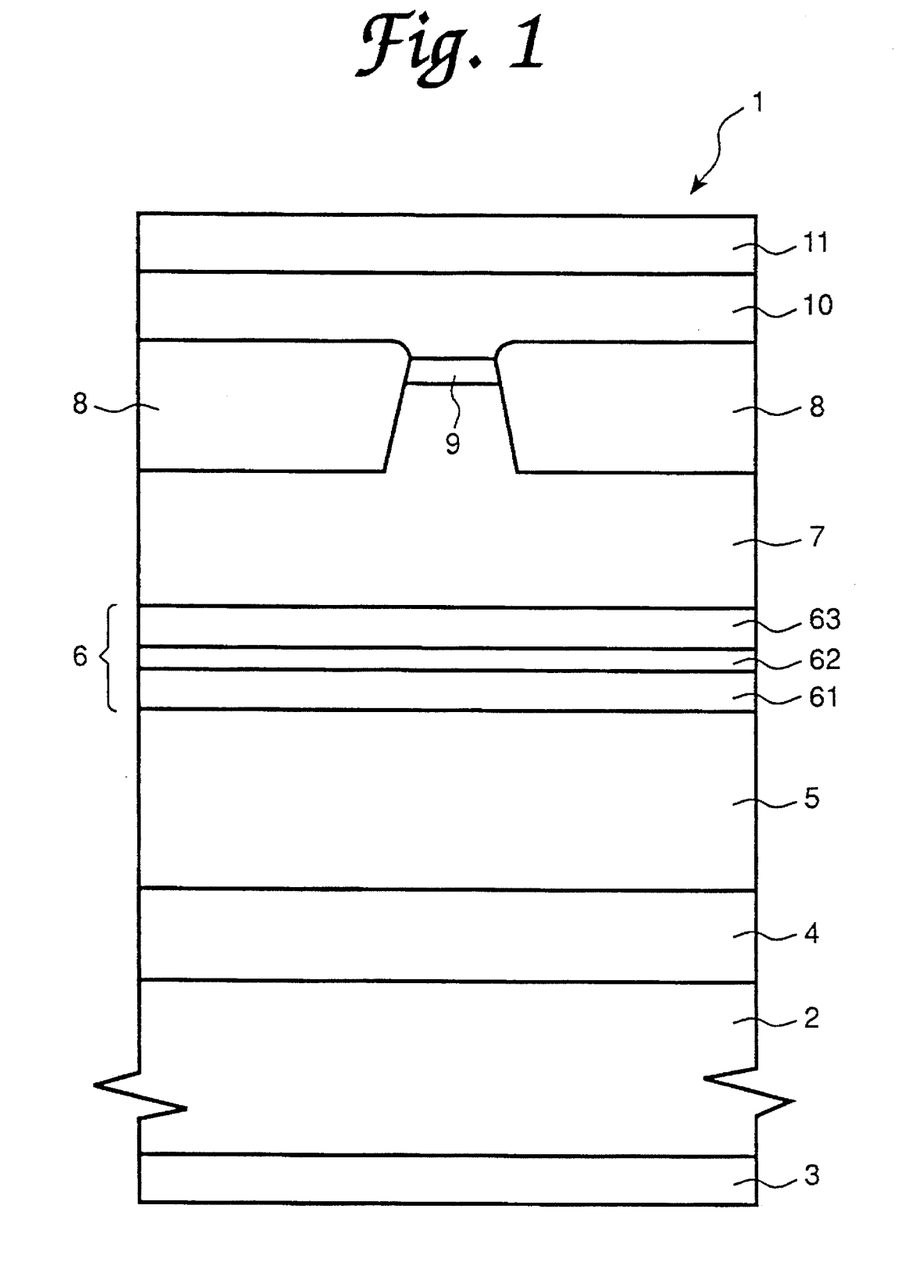
FIG. 1 shows a sectional structural view of one embodiment of the present invention.

FIG. 1 shows a sectional structural view of one embodiment of the present invention. A semiconductor laser 1 uses an n-GaAs substrate 2. An n-type electrode 3 is formed on a rear side of the n-GaAs substrate 2, and on an upper side thereof, an n-AlGaInP cladding layer 5, an AlGaInP optical waveguide layer 6, a p-AlGaInP cladding layer 7 and a p-GaInP layer 9 are sequentially grown on an n-GaAs buffer layer 4 by epitaxial growth.

The AlGaInP optical waveguide layer 6 is of three-layer structure which comprises an AlGaInP optical confinement layer 61, an AlGaInP strained active layer 62 and an AlGaInP optical confinement layer 63. Since the refractive index of the optical waveguide layer 6 is higher than those of the n-AlGaInP cladding layer 5 and the p-AlGaInP cladding layer 7, the laser beam generated in the AlGaInP strained active layer 62 is confined in the optical waveguide layer 6. The p-AlGaInP cladding layer 7 has both shoulders thereof etched away as shown to form a mesa which extends normally to the plane Of the drawing. The n-GaAs blocking layers 8 are buried in the etched-away areas to the substantially same height as that of the surface of the p-GaInP layer, and a p-GaAs contact layer 10 and a p-electrode 11 are formed thereon. Carrier concentrations of the respective layers are $n=2\times10^{18}$ cm$^{-3}$ for the n-GaAs substrate 2 and the n-GaAs buffer layer 4, $n=2\times10^{17}$ cm$^{-3}$ for the n-AlGaInP cladding layer 5, $p=5\times10^{17}$ cm$^{-3}$ for the p-AlGaInP cladding layer 7, and $p=2\times10^{18}$ cm$^{-3}$ for the p-GaInP layer 9 and the p-GaAs contact layer 10. The thicknesses of the respective layers are 80 μm for the n-GaAs substrate 2, 0.5 μm for the n-GaAs buffer layer 4, 1 μm for the n-AlGaInP cladding layer 5, 0.21 μm for the optical waveguide layer 6, 1 μm for the p-AlGaInP cladding layer 7 (0.5 μm at the opposite shoulders), 0.2 μm for the n-GaAs blocking layer 8, and 0.3 μm for the p-GaAs contact layer 10.

Figure 2A:
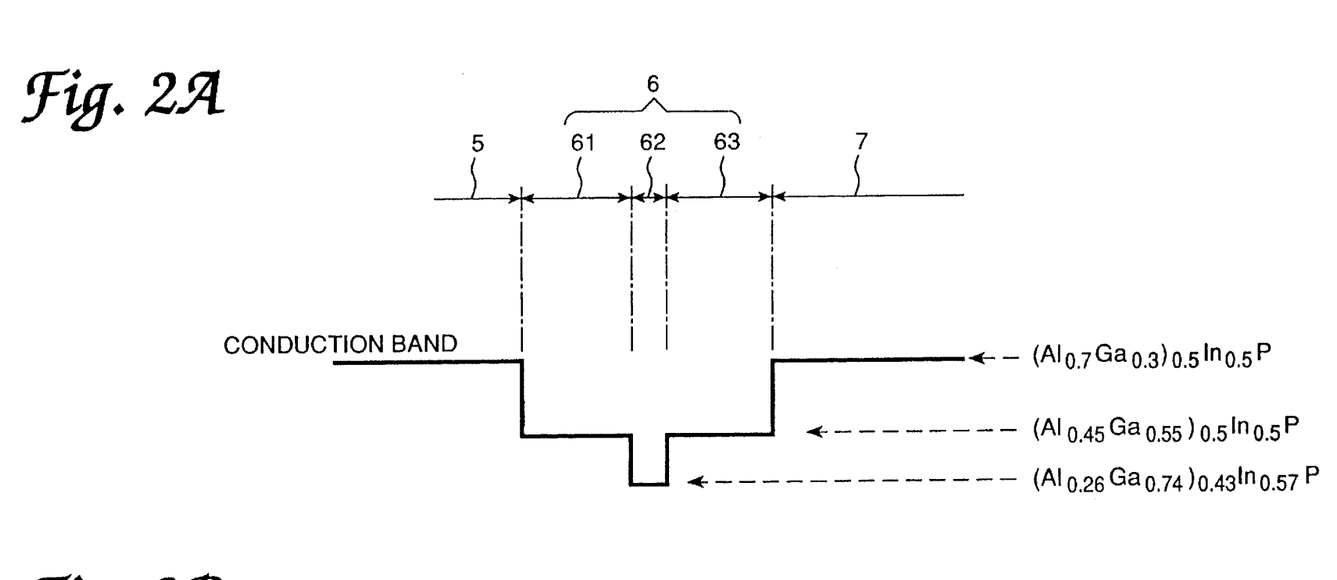
FIG. 2 shows an energy band thereof.
Figure 2B:
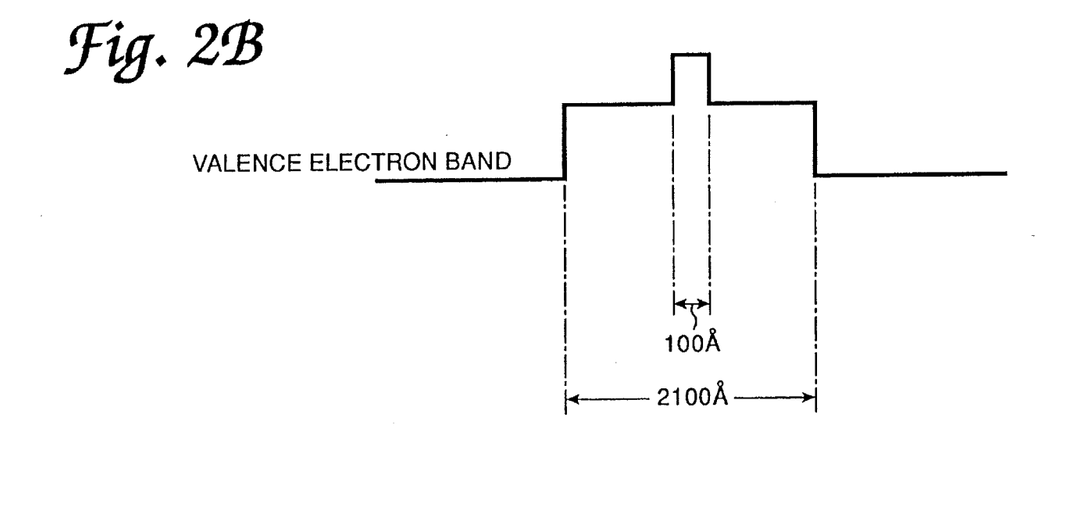

FIG. 2 shows the energy band in the n-AlGaInP cladding layer 5, the AlGaInP optical waveguide layer 6 and the p-AlGaInP cladding layer 7. A well structure of the energy band is formed in the optical waveguide layer 6. When OMVPE is used in the epitaxial growth, such a well structure is formed by temporarily increasing the supply rate of the organic In gas when the AlGaInP strained active layer 62 is formed. Accordingly, the electrons and holes injected from the n-electrode 3 and the p-electrode 11 are confined in the cell, that is, the AlGaInP strained active layer 62 and the light is emitted therein.

A characteristic feature of the present embodiment is that a lattice constant of the AlGaInP strained active layer 62 is larger than the lattice constant a of the n-GaAs substrate 2 by Δa. Specifically, Δa/a= 0.3% to 1%. On the other hand, the lattice constant of the epitaxial layer other than the AlGaInP strained active layer 62 including the AlGaInP optical confinement layers 61 and 63 is substantially equal to that of the n-GaAs substrate 2. As a result, a compressive stress is always applied to the AlGaInP strained active layer 62. Accordingly, the oscillation threshold is lower than that of the unstrained condition. This is very effective to the visible light semiconductor laser which uses the AlGaInP active layer in which the continuous oscillation is very difficult to attain due to the rise of the oscillation threshold by the addition of Al.

When a strain is applied by the difference between the lattice constants, a transition occurs unless the thickness of the layer to which the strained is applied is sufficiently small. A relation between the strained and the maximum film thickness (critical film thickness) to prevent the generation of misfit dislocations, for GaInP is reported in "5th OMVPE International Conference (1990)" and it is considered that the same is generally applicable to AlGaInP.

In the present embodiment, the composition of the AlGaInP strained active layer 62 for $(Al_xGa_{1-x})_yIn_{1-y}P$ is x= 0.26 and y=0.43, the composition of the AlGaInP optical confinement layers 61 and 63 is x=0.45 and y= 0.5, and the composition of the n-AlGaInP cladding layer 5 and the p-AlGaInP cladding layer 7 is x=0.7 and y=0.5. The deviation of the lattice constant of the AlGaInP mixed crystal semiconductor from that of the GaAs semiconductor is determined by y which is selected to be no greater than 0.45. As a result, the lattice constant of only the AlGaInP strained active layer 62 deviates from that of the n-GaAs substrate 2 in a preferred manner. The value x is selected in accordance with a desired oscillation wavelength.

In the structure of the present embodiment, the transition does not occur when the thickness of the AlGaInP strained active layer 62 is 0.01 μm (100 Å). When the well is thin, it becomes a quantum well but the quantum effect is not so important in the present invention and the application of the strained is important. In general, when the active layer is too thin, the emitted light is vertically spread by a diffraction effect. In the structure of the present embodiment, since the optical confinement layers 61 and 62 are provided and the optical waveguide layer 6 is sufficiently thick, the spread of the emitted light is suppressed.

Figure 3A:
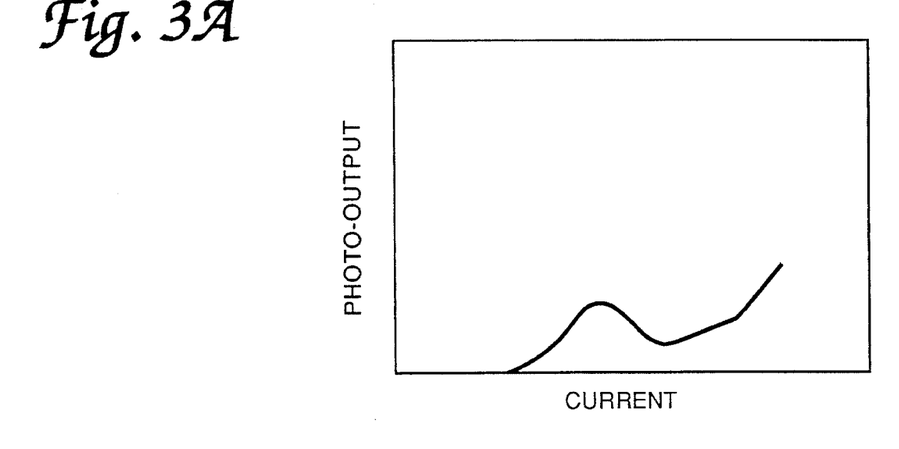
FIGS. 3A, 3B and 3C show a current-photo-output characteristic.

However, when the semiconductor layer of the present embodiment was experimentarily operated, it was proved that not only the continuous oscillation was attained but also it exhibited a very unique characteristic. Namely, when the semiconductor laser of the present embodiment was operated at −6° C., a current-photo-output characteristic showed an inversed S-shape as shown in FIG. 3A. Such a report has not been made heretofore and it is considered that it shows that a light emission process which is different from a usual one takes place in the strained active layer 62. The stripe width of the semiconductor laser used in the experiment is 5 μm and the wavelength of the emitted laser beam is approximately 0.62 μm. This phenomenon is not only novel but also useful to the industry. For example, when it is paired with a conventional laser having a characteristic shown in FIG. 3B, a total current-photo-output characteristic is one shown in FIG. 3C. In a region A shown therein, the photo-output is stable to the change of current.

Figure 3B:
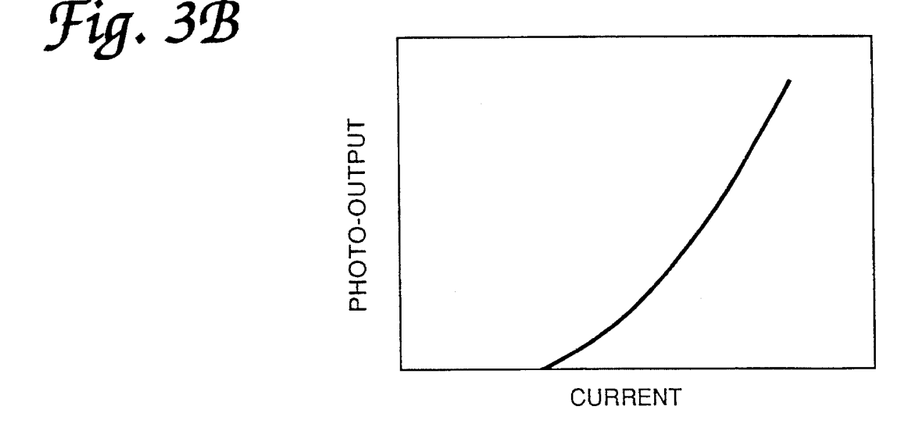
Figure 4:
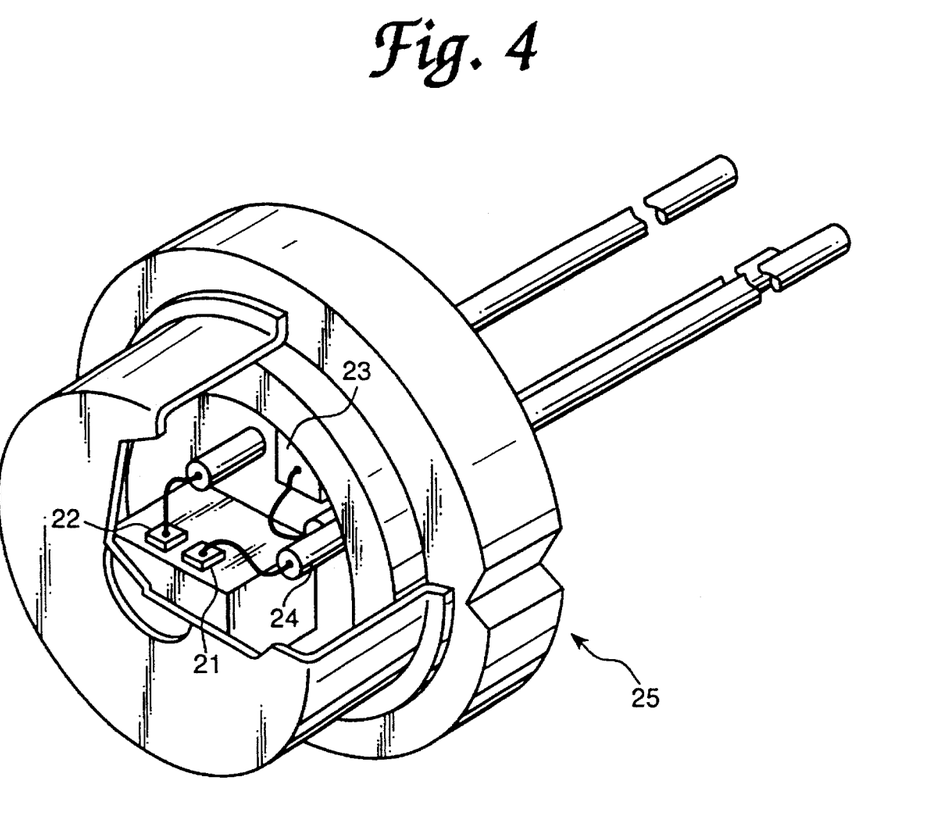
FIG. 4 shows a perspective view of a laser light emitting device.

An example of a construction of such a laser light emitting apparatus is shown in FIG. 4. A laser chip has an inverted S-shaped current-photo-output characteristic as shown in FIG. 3A. A laser chip 22 has a conventional current-photo-output characteristic as shown in FIG. 3B. Sizes of those chips 21 and 22 are approximately 300 μm×300 μm, respectively, and they are arranged in pair with a spacing of approximately 100 μm. A Si photo-sensing device 23 is arranged in the apparatus. Those devices are connected to an external circuit through lead rods 24.

Figure 3C:
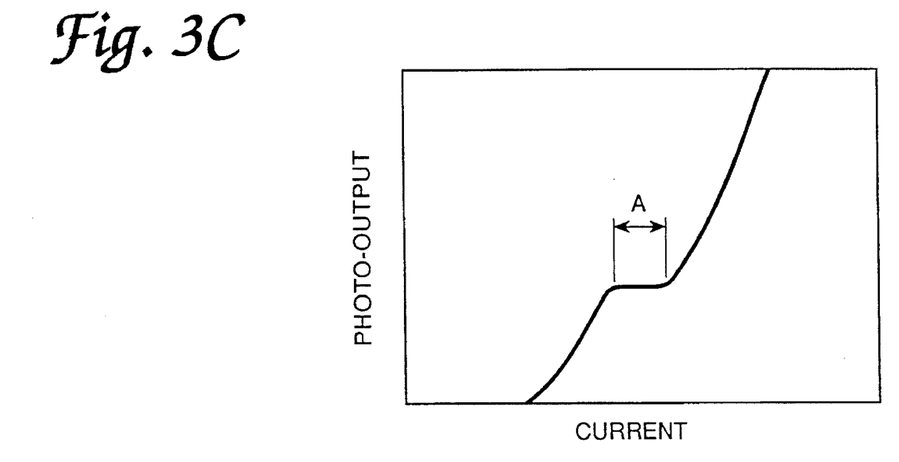

In the present construction, the photo-outputs of the laser chips 21 and 22 are combined to produce a current-photooutput characteristic of the entire laser light emitting apparatus 25 as shown in FIG. 3C. Thus, a stable photo-output is attained in the region A.

Figure 5:
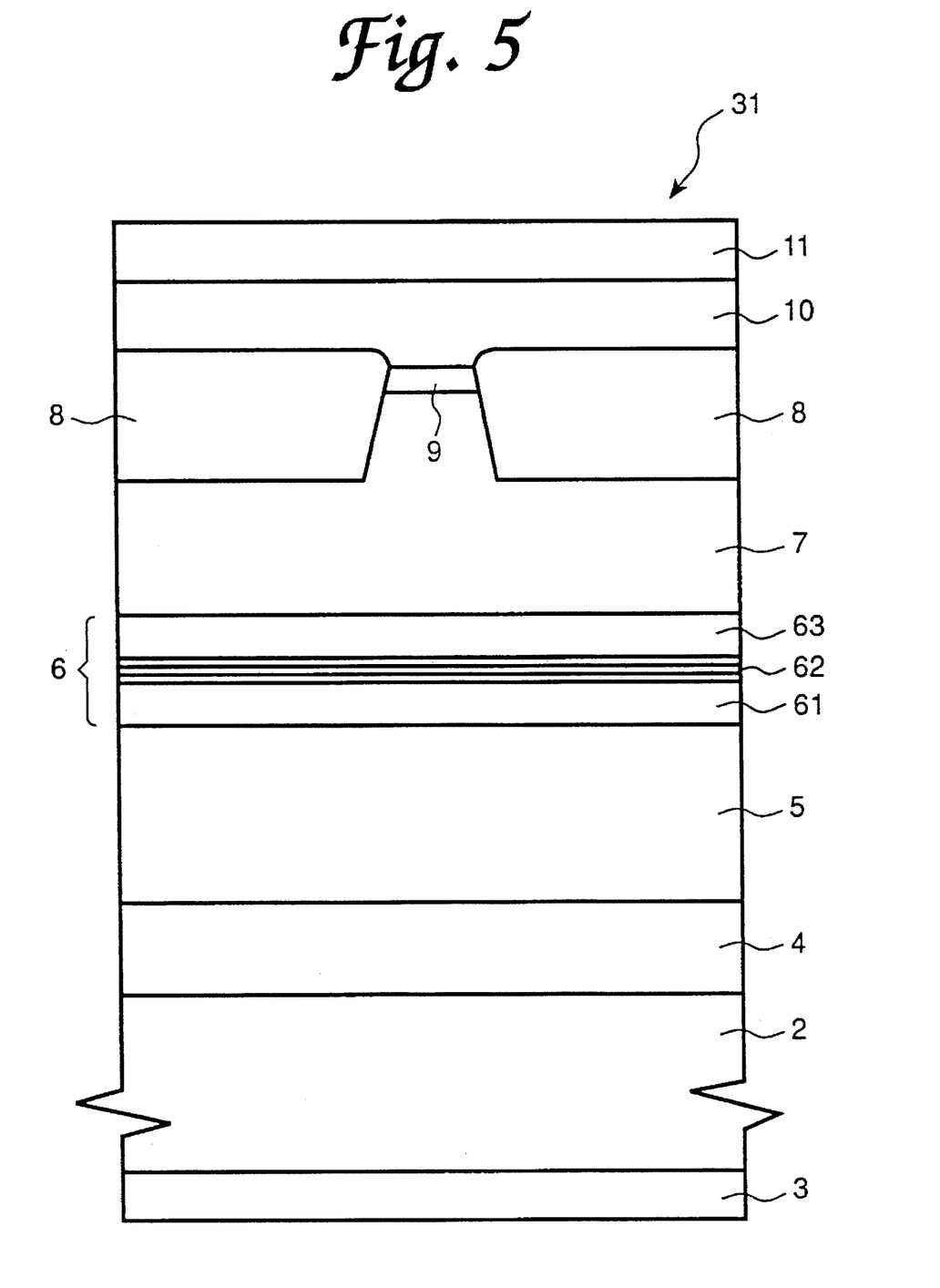
FIG. 5 shows a sectional structural view of another embodiment of the present invention.

FIG. 5 shows a sectional view of a structure of another embodiment of the present invention. The like elements to those shown in FIG. 1 are designated by the like numerals and the explanation thereof is omitted.

Figure 6A:
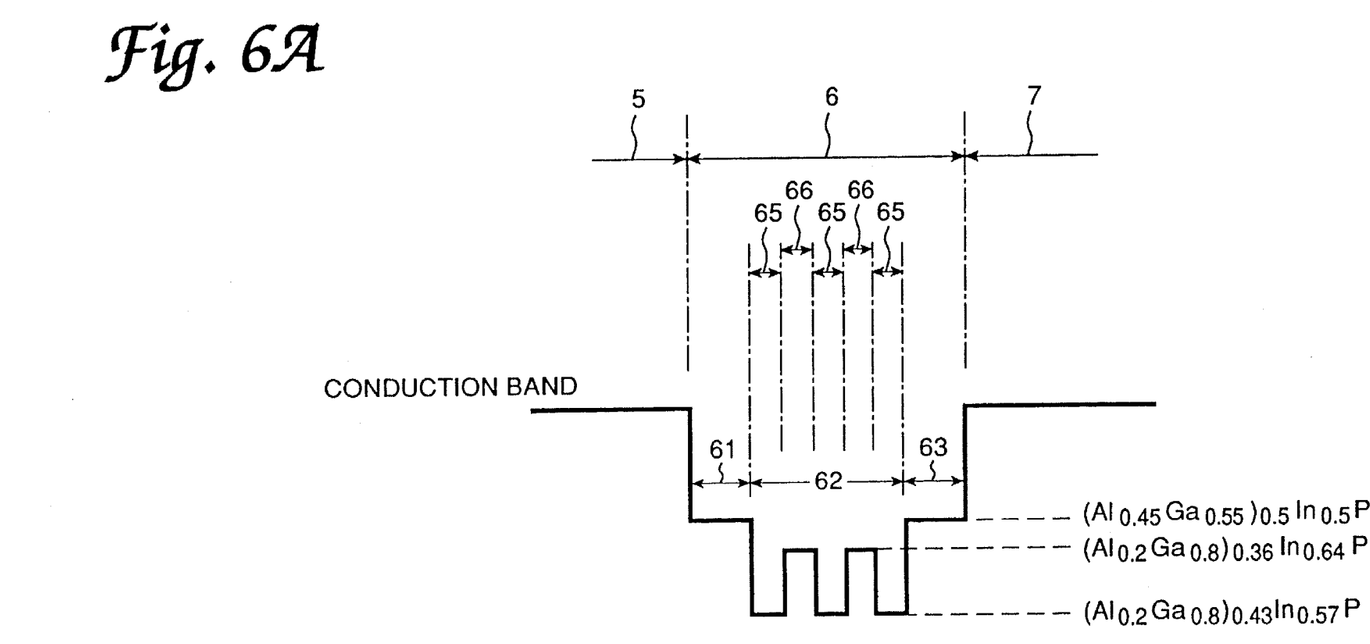
FIG. 6 shows an energy band of the embodiment in FIG. 5.
Figure 6B:
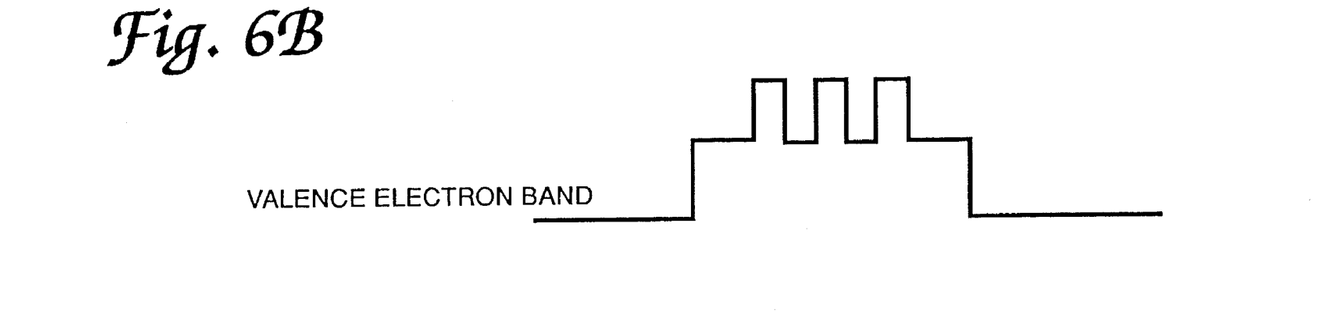

In the present embodiment, an AlGaInP strained active layer 62 of an optical waveguide layer 6 is of multi-layer well structure in order to produce a high power from the laser. Namely, the AlGaInP optical waveguide layer 8 comprises AlGaInP optical confinement layers 61 and 63 and an AlGaInP strained active layer 62, and the AlGaInP strained active layer 62 is constructed three strained quantum wells. FIG. 6 shows an energy band diagram which more clearly shows the strained multi-quantum well structure. It shows the energy band of the AlGaInP strained active layer 62 as well as the AlGaInP optical confinement layers 61 and 63, the n-AlGaInP cladding layer 5 and the p-AlGaInP cladding layer 7.

The composition of the well layers 65 and the barrier layers 66 is given by $(Al_xGa_{1-x})_yIn_{1-y}P$, x=0.2 and y=0.43 for the well layers 65, and x=0.2 and y=0.36 for the barrier layers 66. The composition y of the well layers 65 is selected to be no greater than 0.45 and the composition x is selected in accordance with the oscillation wavelength. The compositions of the AlGaInP optical confinement layer 61, the AlGaInP optical confinement layer 63, the n-AlGaInP cladding layer 5 and the p-AlGaInP cladding layer 7 are identical to those of the first embodiment. The thickness of the optical waveguide layer 6 is 0.3 μm, and the thicknesses of the well layers 65 and the barrier layers 66 are 100 Å and 50Å, respectively.

In general, in the multi-layer well structure, the larger the total thickness of the well is, the easier the misfit dislocations takes place even if the thickness of the individual well is less than the critical thickness. On the other hand, in the present embodiment, the lattice constant is selected such that a stress which is of opposite direction to that of the well layer 65, that is, a tensile stress is applied to the barrier layer 86.

As a result, the stress of the entire AlGaInP strained active layer 62 is suppressed and no transition takes place. The lattice constant of the barrier layers 66 may be one which matches to that of the GaAs substrate 2. A tensile stress is also applied to the barrier layer 66 so that no misfit dislocation takes place.

In the second embodiment, since the optical waveguide layer 6 is sufficiently thick, the spread of the emitted light is suppressed. The multi-layer well structure semiconductor laser of the second embodiment also exhibits the current-photo-output characteristic as shown in FIG. 3(a), and when it is paired with a semiconductor laser having a conventional current-photo-output characteristic, a laser light emitting apparatus which shows a stable current-photo-output characteristic is attained.

The multi-layer well structure semiconductor laser of the second embodiment is manufactured in the following manner.

The semiconductor laser 31 uses the n-GaAs substrate 2 having the n-electrode 3 formed on the rear surface thereof, as it does in the first embodiment. On the upper surface of the n-GaAs substrate 2, the n-GaAs buffer layer 4, the n-AlGaInP cladding layer 5, the AlGaInP optical waveguide layer 6, the p-AlGaInP cladding layer 7 and the p-GaInP layer 9 are sequentially grown by OMVPE.

After the epitaxial growth of those layers, portions of the p-GaInP layer 9 and the n-AlGaInP cladding layer 7 are etched away to form a mesa which extends normal to the plane of the drawing. The n-GaAs blocking layer 8 is grown in the etched-away regions to a height which is substantially equal to that of the p-GaInP layer 9 to bury the mesa which comprises the p-GaInP layer 9 and the p-AlGaInP cladding layer 7. The p-GaAs contact layer 10 and the p-electrode 11 are epitaxially grown thereon to complete the semiconductor laser 31. The laser beam is emitted from the optical waveguide layer 6 along the mesa, that is, normal to the plane of the drawing, when a forward bias is applied across the electrodes 3 and 11.

Figure 7:
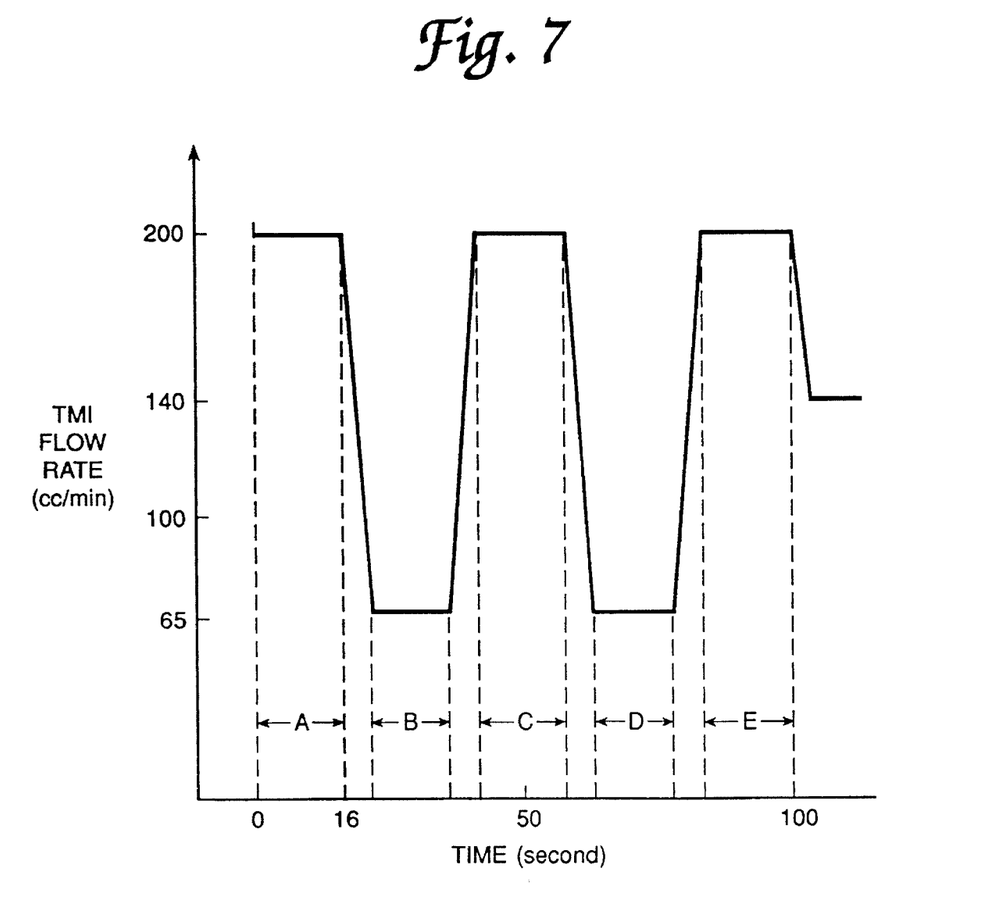
FIG. 7 shows a graph of flow rate control of raw material gas in manufacturing the semiconductor laser of the embodiment in FIG. 5.

The most characteristic feature of the present manufacturing method is the method for manufacturing the AlGaInP strained active layer 62. Basically, it is formed by OMVPE. As source gasses, trimethyl indium (TMI), triethyl gallium (TEG), trimethyl aluminum (TMA), arsine, phosphine, hydrogen selenide, and diethyl zinc are used. The gas pressure is 60 Torr. What is important is that the flow rate of only the TMI gas is changed as shown in FIG. 7 and the flow rates of other gasses are kept constant during the epitaxial growth. In FIG. 7, the abscissa represents a time (in second) and the ordinate represents the flow rate (in cc/min) of TMI. In regions A, C and E in FIG. 7, the TMI gas flow rate is set to 200 cc/min to form the well layer 65, and in regions B and D, the TMI gas flow rate is set to 65 cc/min to form the barrier layer 66. In this manner, the well layer 65 having x=0.2 and y=0.4, and the barrier layer 66 having x=0.2 and y=0.36 in the composition of $(AlGa_{x-1})_yIn_{y-1}P$ were formed. The multi-layer structure thus formed exhibits an energy band of the multi-quantum well structure as shown in FIG. 6, and the lattice constant of the well layer 65 is larger than that of the n-Gas substrate 2 so that the well layer 65 receives compressive stress. On the other hand, the lattice constant of the barrier layer 66 is smaller than that of the n-Gas substrate 2 and the barrier layer 66 receives a tensile Stress. The flow rates of the other gases are fixed and selected to grow a crystal which has a lattice-matching with the n-Gas substrate 2 at a growth rate of 1.8 μm/min when the TMI gas flow rate is 140 cc/min. Since the source flow rate of In is larger than those of Ga and Al, the control is relatively easy. Alternatively, the TMI gas flow rate may be set to 140 cc/min in the regions B and D so that the barrier layer 66 matches to the GaAs substrate 2. In this case, the barrier layer 66 receives a tensile stress.

The time from the change of the TMI gas flow rate to the reflection to the change in the composition of the crystal varies from apparatus to apparatus. The required time may be preexamined. It is assumed 5 seconds herein. In order to make specific settings to the time, a timing of the flow rate change is varied to prepare a number of strained multi-quantum wells, an average lattice constant is determined by an X-ray diffraction, and a condition to match it to the n-GaAs substrate 2 is determined.

In the present embodiment, OMVPE is used to epitaxially grow the AlGaInP strained active layer 62 although molecular beam epitaxy may be used.

In the latter case, two In injection cells are prepared, and one of the In injection cells is always activated while the other In injection cells is controlled between activation and deactivation during the growth of the AlGaInP active layer 62.

In this manner, the supply of In can be changed. As a result, the AlGaInP strained active layer 62 having the some strained multi-quantum well structure as that of the second embodiment is produced.

While AlGaInP is used as the material for the strained active layer, GaInP may also be used. In this case, the strained multi-quantum well structure is produced by controlling the supply of In in the same manner. In general, when GaInP is used, the wavelength is longer than when AlGaInP is used.

For the invention thus described, it should be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A method for manufacturing a semiconductor laser having a multi-quantum well structure of AlGaInP formed in an active layer, comprising the step of:

epitaxially growing the multi-quantum well structure by periodically changing a supply rate of only In.

2. A method for manufacturing a semiconductor laser according to claim 1 wherein the epitaxial growth is done by OMVPE, and the supply rate of In is periodically changed by periodically changing a flow rate of organic In source gas.

3. A method for manufacturing a semiconductor laser of according to claim 2 wherein the organic In source gas is TMI.

4. A method for manufacturing a semiconductor laser according to claim 1, further comprising the steps of:

preparing first and second In source injection cells;

activating the first In source injection cell; and periodically activating and deactivating the second In source injection cell while the first In source injection cell is activated for periodically changing the supply rate of only In, wherein the step of epitaxially growing is performed by molecular beam epitaxy.

5. A method for manufacturing a semiconductor laser having a multi-quantum well structure of AlGaInP formed in an active layer, comprising the step of:

forming the multi-quantum well structure in the active layer by organo-metallic vapor phase epitaxy, wherein the organo-metallic vapor phase epitaxy is performed by periodically changing a flow rate of organic In source gas and maintaining a flow rate of other organic source gases as constant.

6. A method according to claim 5, wherein the organic In source gas is TMI.

7. A method for manufacturing a semiconductor laser having a multi-quantum well structure of GaInP formed in an active layer, comprising the step of:

forming the multi-quantum well structure in the active layer by organo-metallic vapor phase epitaxy, wherein the organo-metallic vapor phase epitaxy is performed by periodically changing a flow rate of organic In source gas and maintaining a flow rate of other organic source gases as constant.

8. A method according to claim 7, wherein the organic In source gas is TMI.

9. A method for manufacturing a semiconductor laser having a multi-quantum well structure of GaInP formed in an active layer, comprising the steps of:

epitaxially growing the multi-quantum well structure by periodically changing a supply rate of In; and maintaining a supply rate of other materials as constant.

10. A method according to claim 9, wherein the step of epitaxially growing is performed by organo-metallic vapor phase epitaxy, and the supply rate of In is defined by periodically changing a flow rate of organic In source gas.

11. A method according to claim 10, wherein the organic In source gas is TMI.

12. A method according to claim 9, further comprising the steps of:

preparing first and second In source injection cells;

activating the first In source injection cell; and periodically activating and deactivating the second In source injection cell while the first In source injection cell is activated for periodically changing the supply rate of In, wherein the step of epitaxially growing is performed by molecular beam epitaxy.

13. A method for manufacturing a semiconductor laser having a multi-quantum well structure of AlGaInP formed in an active layer, comprising the steps of:

forming the multi-quantum well structure in the active layer by molecular beam epitaxy with first and second In source injection cells;

activating the first In source injection cell;

periodically activating and deactivating the second In source injection cell while the first In source injection cell is activated for periodically changing the supply rate of In; and maintaining a supply rate of Al as constant.

* * * * *